Figure 1:
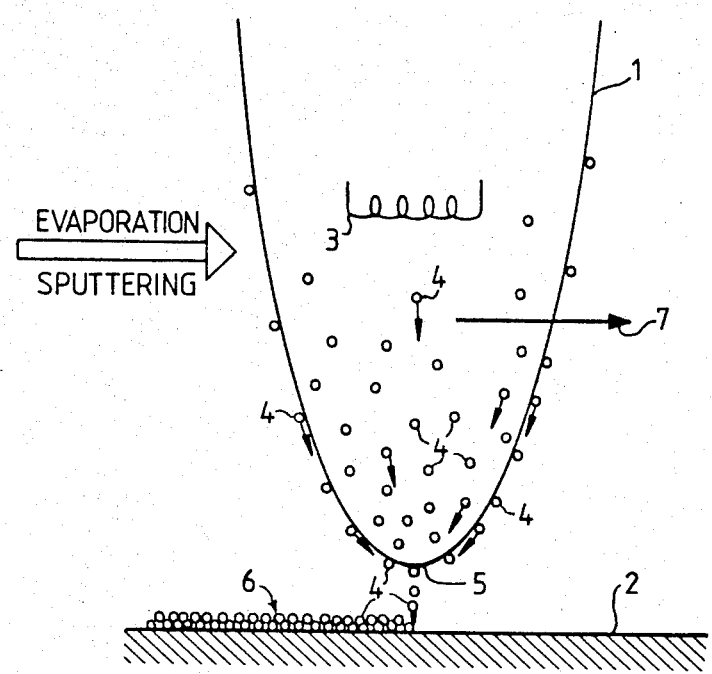

United States Patent [19]

Binnig et al.

[11] Patent Number: 4,539,089
[45] Date of Patent: Sep. 3, 1985

[54] METHOD FOR DEPOSITING MATERIAL WITH NANOMETER DIMENSIONS

[75] Inventors: Gerd K. Binnig, Richterswil; Christoph E. Gerber, Adliswil; Heinrich Rohrer, Richterswil; Edmund Weibel, Adliswil, all of Switzerland

[73] Assignee: International Business Machines Corporation, Armonk, N.Y.

[21] Appl. No.: 626,177

[22] Filed: Jun. 29, 1984

[51] Int. Cl.³ .............................................. C23C 15/00
[52] U.S. Cl. .............................. 204/192 R; 29/576 R; 427/43.1; 430/272; 430/296; 430/322; 430/394; 430/396; 430/942
[58] Field of Search .............. 427/43.1; 430/272, 396, 430/394, 322, 296, 942; 204/192 R; 29/576 R

[56] References Cited

U.S. PATENT DOCUMENTS 3,971,860  7/1976  Broers et al. ................ 427/43.1
4,197,332  4/1980  Broers et al. ................ 430/272
4,467,026  8/1984  Ogawa ........................ 427/43.1

Primary Examiner—Arthur P. Demers
Attorney, Agent, or Firm—Alvin J. Riddles

[57] ABSTRACT

This method involves the deposition of free metal atoms (4) from the apex (5) of a pointed tip (1) supported at a distance of 10 to 20 nm from a substrate (2). The atoms (4) are being field-desorbed under the influence of a strong electric field existing between the tip (1) and the substrate (2). With the tip (1) being moved across the substrate (2), a narrow trace (6) of metal atoms will be deposited on the substrate.

11 Claims, 1 Drawing Figure

METHOD FOR DEPOSITING MATERIAL WITH NANOMETER DIMENSIONS

The invention relates to a method for depositing material onto a substrate in the form of configurations having dimensions in the range of nanometers. The method provides for the migration of the material to be deposited down a conductive tip from which it is desorbed by an electrical field existing between the tip and the surface of the substrate.

The recent advantages in the design of electronic circuits call for ever decreasing widths of conductive lines connecting electronic components on chips and modules as well as for decrease of the dimensions of those components per se in favor of the increase of their packing density and the decrease of their switching time and power dissipation.

Known in the art are various proposals for producing very fine lines. With electron beam fabrication techniques exploratory devices have been made with structures between 50 and 100 nanometers wide. Smaller dimensions are not achievable with this technique because of electron scattering effects. The technique of lithography, i.e. the formation of a pattern in a layer of photo-resist which is later used to protect regions to be differentiated from other regions, with an electron beam used to alter the properties of the photo-resist and later development, has yielded still narrower features.

However, this technique has the disadvantage that owing to focussing problems of the electron beam, too much of the resist in an ordinary layer was being irradiated. Yet with this technique, when the resist could be caused to re-condense onto the sample surface from the vapor and then polymerize, a fine line in the order of 50 nm could be produced in a final ion beam etching step. This work is described in Microelectronics and Reliability, Vol. 4, pp. 103–104, 1965, Pergamon Press.

Since the effects of electron backscattering from the substrate were found to be limiting the resolution of the irradiated resist pattern, a non-backscattering substrate was developed and described in U.S. Pat. No. 3,971,860. This improved substrate permitted a reduction of the line widths down to 30 nm.

A step further down was tought by GB-A-No. 2007158. In accordance with this reference, patterns with line widths of less than 10 nm are fabricated by electron beam converting and fixing a pattern of resist having precise thickness and width dimensions on a thin film type member that is supported by an electron backscattering control substrate. The resist is present on the surface of the member in a thickness that is less than the thickness required for the desired pattern and arrives at the point of impact of the electron beam reaction zone by surface migration. The electron beam converts and fixes the resist on the surface, and through surface migration the pattern builds to the proper dimensions.

The apparent disadvantage of this technique is, of course, the requirement of a very sharply focused electron beam which interacts with a photo-resist layer of a well defined and therefore narrow-tolerance thickness.

It is accordingly an object of the present invention to propose a method for depositing material with nanometer dimensions without using the disadvantageous intermediary steps required by prior art proposals. The method in accordance with the invention involves depositing material from a conductive tip onto a substrate, the tip being supported at a controlled distance shorter than $5 \cdot 10^{-8}$ m from the surface of said substrate. The tip is provided with free metal atoms at its surface which atoms, at the operating temperature of the tip, have a sufficiently large mobility to permit their movement versus the apex of the tip. A potential difference is being maintained between tip and substrate at a level sufficient to lead to field-desorption of the free metal atoms across the distance between tip and substrate.

Details of an embodiment of the invention will hereafter be described by way of example with reference to the attached drawing in which FIG. 1 is a schematic diagram of a conductive tip supported above a substrate on which a trace of material is deposited.

In FIG. 1 a conductive tip 1, which may consist, for example, of tungsten, is supported at a constant distance in the order of 5 nm above the surface of a substrate 2. Those skilled in the art of tunnel microscopy know how to employ the changes of the tunnel current to control the distance between tip and surface to within 10% or less of the desired magnitude to compensate for the unavoidable surface roughness at the dimensions under consideration.

The operating temperature of tip 1 can be adjusted by a heating device generally represented by a heating coil 3 so that the mobility of the free metal atoms 4 attaching to the tip's surface is raised to a point where the atoms become readily displaceable thereon. These free atoms may be gold, for example, and can be supplied to the tip by way of evaporation or sputtering at a location distant from the tunnel gap.

The tungsten tip 1 per se remains stable as its temperature is raised to permit the metal atoms 4 at its surface to migrate versus the tip's apex. A potential is applied between tip 1 and substrate 2, which causes the metal atoms 4 at the point of maximum of the electrical field to be field-desorbed and tunnel through the gap between tip 1 and substrate 2. Upon reaching the surface of substrate 2, the atoms 4 are deposited thereon and form a trace 6 while tip 1 is moved across substrate 2 as indicated by arrow 7.

The term field-desorption describes the release of the free metal atoms 4 from the adhesive forces which normally keep them attached to the surface of tip 1. Field-desorption only occurs in the presence of a strong electric field, i.e. where the distance between tip 1 and substrate 2 is small and the voltage high. Illustrative values in this regard for free gold atoms on a tungsten tip are 2 volts and $5 \cdot 10^{-8}$ m. Gallium requires similar values.

The field-desorption modulates the tunneling current which, therefore, can be taken as a measure for the field-desorption rate.

Obviously, the rate at which the field-desorbed material has to be replenished onto tip 1 must at least be equal to the maximum field-desorption rate.

The replenishment of material may be accomplished in several ways. One method could involve the evaporation of the material from an evaporation source inside the field-desorption enclosure but at a location far away from the tunnel region to prevent interference between the two processes. Another method could rely on sputtering. Of course, an exhausted tip could simply be replaced by a fresh one, and with appropriate equipment in place inside the field-desorption enclosure, the replacement can be made under the same vacuum.

With the apex (5) of tip 1 having a radius of about 10 nm, the trace 6 of atoms deposited on substrate 2 will have a width on the order of 20 nm with a contour roughness of about 1 or 2 nm.

It will be obvious to the man skilled in the lithographic art that devices can be built through application of the inventive method by depositing intersecting lines with or without a dielectric in between, also using different materials for deposition. It may be necessary to perform several scans of the tip across the substrate to obtain a more or less homogeneous layer with no opens.

We claim:

1. Method for depositing material from a conductive tip onto the surface of a substrate, said tip being supported at a controlled distance shorter than $10^{-8}$ m from said substrate, characterized in that said tip (1) is provided with free metal atoms (4) at its surface, the atoms (4) at the operating temperature of the tip (1) having a sufficiently large mobility to permit their movement versus the apex (5) of said tip (1), and that between said tip (1) and said substrate (2) a potential difference is maintained the level of which is sufficient to lead to field-desorption of said free metal atoms (4) across said distance between said tip (1) and said substrate (2) and to the deposition of said atoms (4) on said substrate (2).

2. Method in accordance with claim 1, characterized in that said tip is scanned across said substrate (2) so as to deposit a line (6) of metal atoms (4) on said substrate (2).

3. Method in accordance with claim 2, characterized in that the potential difference between said tip (1) and said substrate (2) is blanked to produce a discontinuous line (6) of metal atoms (4) on said substrate (4).

4. Method in accordance with claim 1, characterized in that said tip (1) consists of tungsten.

5. Method in accordance with claim 1, characterized in that the material to be deposited forms a surface layer on said tip.

6. Method in accordance with claim 5, characterized in that the material to be deposited is replenished by continuous evaporation onto said tip (1) at a location where interference with the field-desorption process is negligible.

7. Method in accordance with claim 5, characterized in that the material to be deposited is replenished by continuous sputtering onto said tip (1) at a location where interference with the field-desorption process is negligible.

8. Method in accordance with claim 1, characterized in that the potential difference between said tip (1) and said substrate (2) is in the order of 2 V.

9. Method in accordance with claim 1, characterized in that said tip (1) is heated for the metal atoms (4) to have sufficient mobility at the surface of said tip (1).

10. Method in accordance with claim 5, characterized in that the material to be deposited is Gallium and that it forms a surface layer on said tip (1).

11. Method in accordance with claims 5 and 9, characterized in that the material to be deposited is gold and that it forms a surface layer on said tip (1), which is heated to a temperature at which the gold has a mobility sufficient to move to the apex (5) of the said tip (1).

* * * * *